United States Patent [19]
Lippitt, III

[11] Patent Number: 5,235,205
[45] Date of Patent: Aug. 10, 1993

[54] LASER TRIMMED INTEGRATED CIRCUIT

[75] Inventor: Maxwell W. Lippitt, III, Satellite Beach, Fla.

[73] Assignee: Harris Corporation, Melbourne, Fla.

[21] Appl. No.: 852,541

[22] Filed: Mar. 17, 1992

Related U.S. Application Data

[62] Division of Ser. No. 689,624, Apr. 23, 1991, Pat. No. 5,096,850.

[51] Int. Cl.5 ............................................. H01L 27/02
[52] U.S. Cl. .................................... 257/528; 257/529; 257/530; 257/532; 257/533; 257/534; 257/538
[58] Field of Search .................. 357/81; 257/528, 529, 257/530, 531, 532, 533, 534, 538

[56] References Cited

U.S. PATENT DOCUMENTS 4,764,485 8/1988 Loughran et al. .
4,960,729 10/1990 Orbach et al. .

OTHER PUBLICATIONS

M. J. Rand "Reliability of LSI Memory Circuits Exposed to Laser Cutting," 17th Annual Proceedings Reliability Physics, San Francisco, Calif. (Apr. 24-26, 1979).
J. B. Gullette & D. M. Green "Laser Personalization of NMOS Digital Topologies", 1983 IEEE International Symposium on Circuits and Systems, Newport Beach, Calif. May 2-4, 1983, vol. 3, pp. 1249-1252.

Primary Examiner—Jerome Jackson
Assistant Examiner—Valencia M. Martin
Attorney, Agent, or Firm—Barnes & Thornburg

[57] ABSTRACT

A method including covering the area to be laser trimmed with a first insulative layer having a thickness sufficiently thin that a layer can trim the area through the first insulative layer. An etch stop is formed on the first insulative layer over the area to be trimmed and covered with a second insulative layer. A portion of the second insulative layer is etched to expose the etch stop and a portion of the etch stop is then removed to expose a portion of the first insulative layer and laser trimming is conducted through the exposed first insulative layer. The etch stop is part of a first level of interconnects made of the same material and simultaneously with the etch stop. The area to be trimmed is part of a second level of contacts that interconnect another second material.

8 Claims, 4 Drawing Sheets

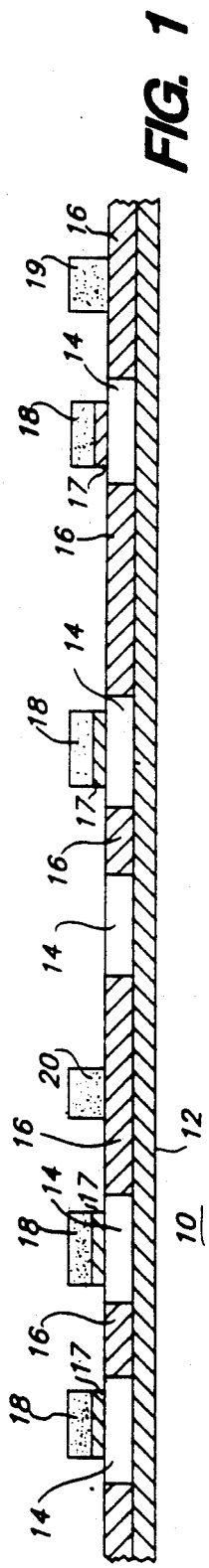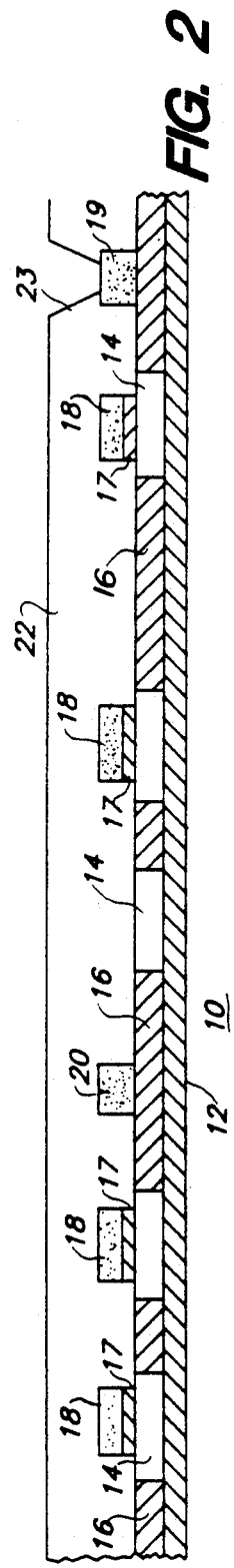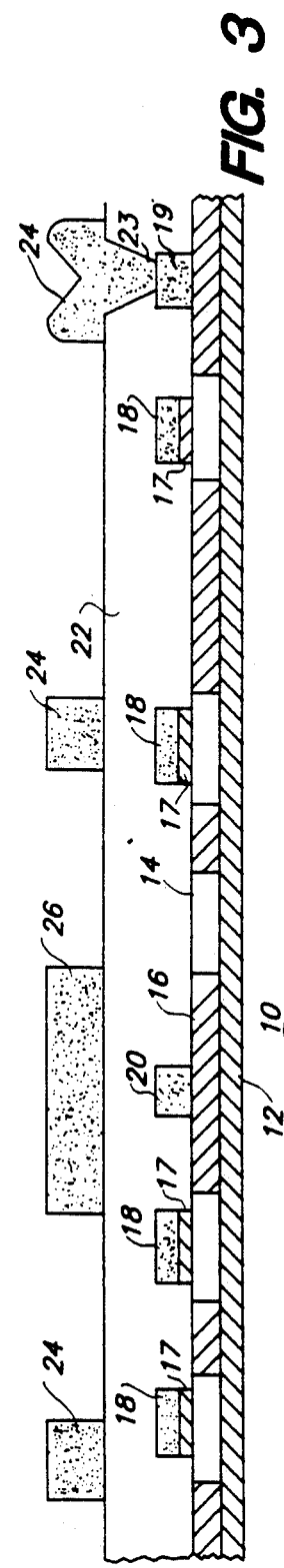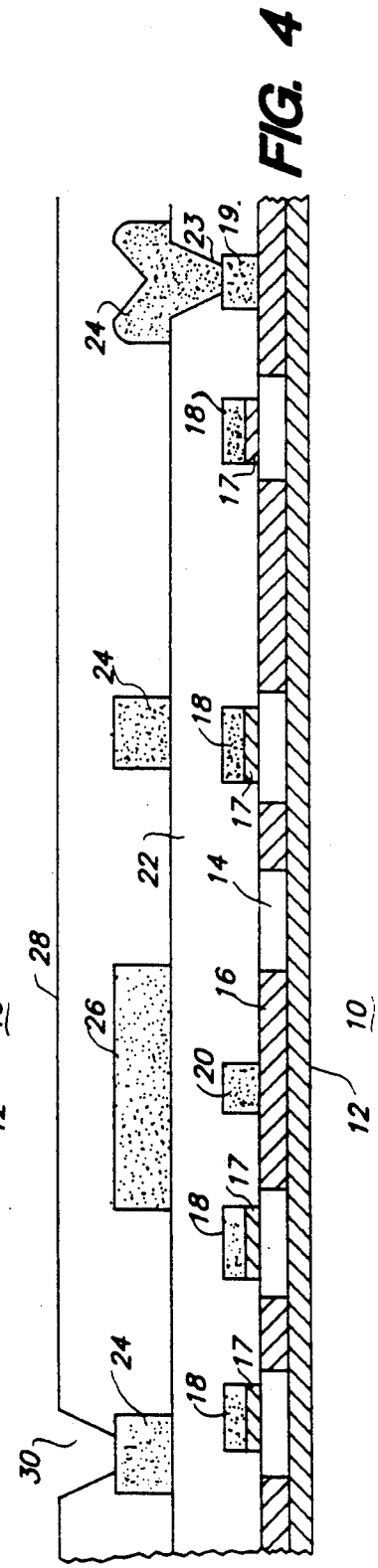

LASER TRIMMED INTEGRATED CIRCUIT

This is a Division of application Ser. No. 07/689,624, filed Apr. 23, 1991 now U.S. Pat. No. 5,096,850 issued Mar. 17, 1992.

BACKGROUND AND SUMMARY OF THE INVENTION

The present application relates generally to laser trimming and more specifically to laser programming.

Laser trimming is used in many manufacturing processes to trim the value of a resistive element, or to program a device or integrated. In arrays, rows and column are to be programmed as well as redundant rows and columns as for example in SRAM. Where the specific value to be stored in the rows and columns is well known, laser trimming can be performed at earlier stages of the process. Similarly if resistors or resistive elements are at a higher level in the integrated circuit, it is readily assessable for laser trimming at the test stage. Wherein the programming involves lower levels of resistors or rows and columns wherein the programming must be performed at the test stage, a very thick oxide is present over the area to be programmed or laser trimmed.

For example, polycrystalline fuses may be covered by as much as 3 microns of oxide. For a YAG laser, the thickness of oxide through which it can penetrate to perform laser trimming should not exceed 1 micron. Thus the oxide over the area to be laser trimmed must be thinned to below 1 micron. The variation with the thickness must also not vary more than 10%. Thus for example, a 7,000 angstrom thickness would vary plus or minus 700 angstroms. This stringent requirement eliminates the possibility of a timed fuse window oxide etch above the fuse because the field oxide between the area to be fused and a first level metal, the dielectric between the first and second levels of interconnects and the pacification layer deposition and etch sigmas are too great. The three sigma variability of the oxide thicknesses over the area to be laser trimmed before the fuse window oxide etch is approximately plus or minus 3,600 angstroms. Thus there exists a need for another approach other than time fuse window etch to provide a window for laser trimming in an integrated circuit.

Thus it is an object of the present invention to provide an accurate method of forming a window in the insulative layers of an integrated circuit to allow laser trimming of an area of an integrated circuit.

These and other objects are achieved by covering the area to be laser trimmed with a first insulative layer having a thickness sufficiently thin that a layer can trim the area through the first insulative layer. An etch stop of a first material is formed on the first insulative layer over the area to be trimmed and covered with a second insulative layer. A portion of the second insulative layer is etched to expose the etch stop using the first material as an etch stop. A portion of the etch stop is then removed to expose a portion of the first insulative layer juxtaposed the area to be trimmed and laser trimming is conducted through the exposed first insulative layer. The etch stop is part of a first level of interconnects made of the same material and simultaneously with the etch stop. The area to be trimmed is part of a second level of contacts and interconnects and of a second material.

A third level of interconnects is provided on the second insulative layer and is connected through vias to the first interconnect level. The vias are formed to the first interconnect level and a third interconnect material is applied before exposing and etching the etch stop. The third interconnect level is formed of a third material and the removing of at least a portion of the second etch stop to expose a portion of the first insulative layer above the area to be trimmed is performed selectively so as not to etch exposed portions of the third interconnect level. A third insulative layer may be provided over the third interconnect level and the removing of a portion of the second insulative layer to expose the etch also removes a portion of the third insulative layer.

The material of the etch stop and the first interconnect level and the material of the third interconnect level are preferably metals while the material of the area to be trimmed is a polycrystalline semiconductor on the substrate. The etch stop is formed to have a greater lateral area than the area to be trimmed and only a portion of the etch stop is removed. This prevents insulative undercutting of the second and third insulative layers.

The resulting structure is a substrate having a first material laser trimmed which is covered by a first insulative layer. The etch stop material is on the first insulative layer having a first aperture exposing the first insulative layer juxtapose the laser trimmed area. Finally a second insulative layer over the second material and the first insulative layer has a second aperture exposing the first aperture in the first material. A first level of interconnects and contacts may be provided between the substrate and the first insulative layer, a second level of interconnects may be provided between the first and second insulative layers and a third level of interconnects may be provided on the top of the second insulative layer.

Other objects, advantages and novel features of the present invention will become apparent from the following detailed description of the invention when considered in conjunction with the accompanying drawings.

BRIEF DESCRIPTION OF THE DRAWINGS

FIGS. 1-9 are cross-sections of an integrated circuit at different stages of fabrication according to the principles of the present invention.

DETAILED DESCRIPTION OF THE DRAWINGS

Figure 5:
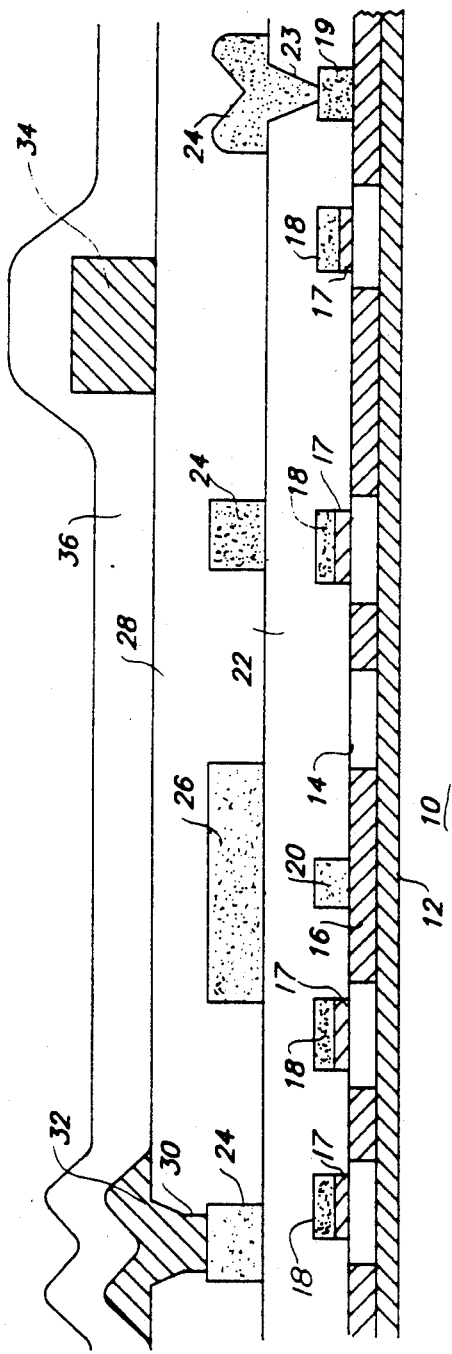

The method of the present invention will be described with respect to laser trimming of an array, for example a memory array and not by way of limitation. As illustrated in FIG. 1, a bulk wafer 10 has an insulative layer 12 thereon and upon which are formed mesa or semiconductor regions 14 separated laterally by insulative regions 16. The process of fabrication does not form a part of this invention and therefore will not be described. A thin gate insulator 17 is formed on the semiconductor regions 10. This step also increases the thickness of insulative regions 16, but not to the extent as on the semiconductor regions 10 and thus this additional insulator has not been illustrated. A first layer of material is formed on the surface of the insulative layer 16 and the gate insulator 17 on the semiconductor regions 14 and patterned to form gates, contacts and interconnects 18, 19 and 20. The portions 18 lying on the insulator 17 and over the integrated circuit portions 14 form gates whereas portions 19 and 20 form interconnects which lie on a first insulative layer 16. The interconnect area 20 is the area to be laser trimmed in this example.

A first insulative layer 22, which is commonly known as field oxide, is applied across the substrate and planarized. Apertures, for example 23 are then formed to expose an interconnect, for example 19, in the first interconnect and contact level as illustrated in FIG. 2 or a portion of semiconductor 14 (not shown). A second material is applied on the first insulative layer 22 and in aperture 23 and patterned to form a second level of interconnects and vias 24 and an etch stop 26. A via from the second level interconnect extends through the aperture 23 to first level interconnect 19. The etch stop 26 has a greater lateral area than the lateral extent of area 20 of the interconnect to be laser trimmed as illustrated in FIG. 3.

A second insulative layer 28 is applied over the first insulative layer 22 and the second level connects interconnects 18 and etch stops 26 and planarized. Aperture 30, for example, is etched to one of the interconnects 24 of the second level as illustrated in FIG. 4. A third material is then deposited on the insulative layer 28 and extending into aperture 30 and in contact with interconnect 24 of the second interconnect level to form a via. The third material is patterned to form contact 32 and interconnect 34. A final insulative layer 36 is then applied as illustrated in FIG. 5.

Figure 6:
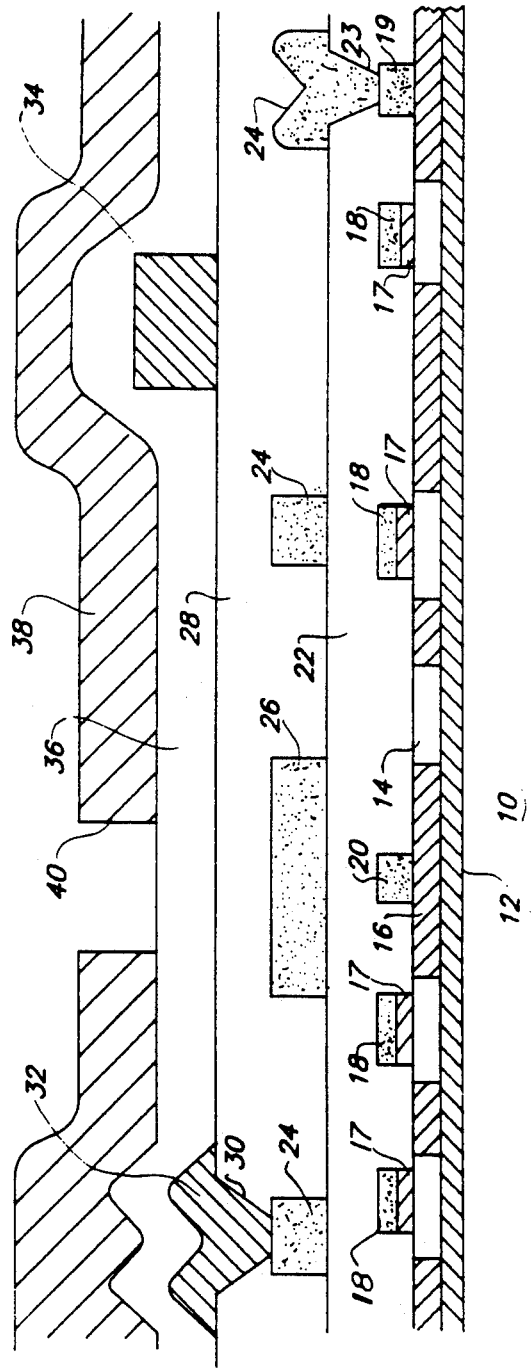
Figure 7:
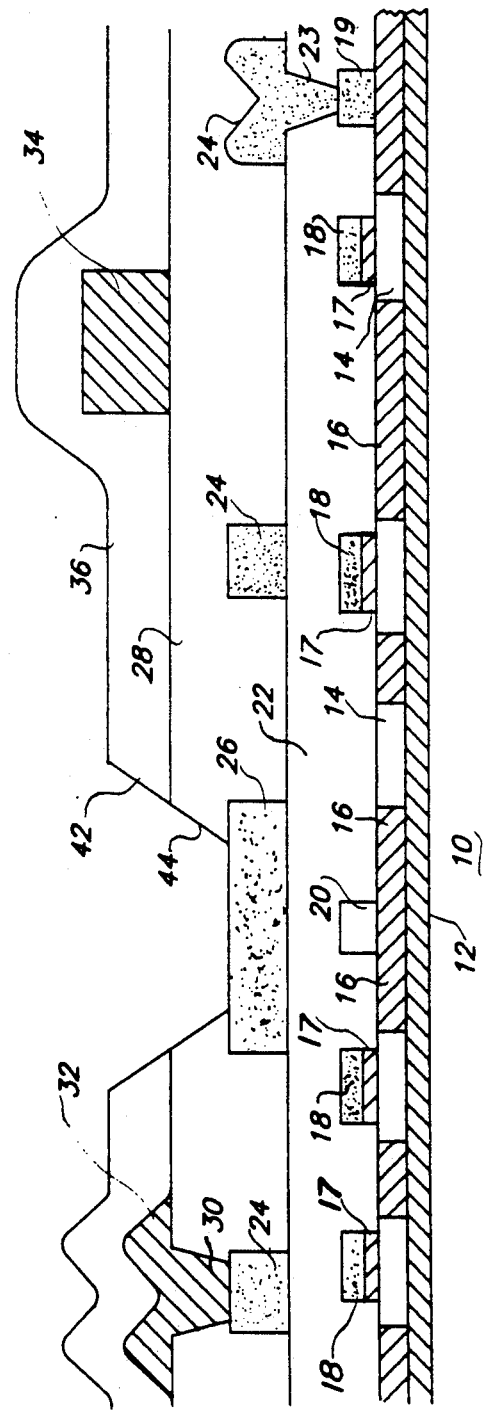

A photo resist layer 38 is then applied and patterned to expose bond pads (not shown) to the third level interconnects 34 as well as the laser trimming windows through aperture 40. This structure is illustrated in FIG. 6. A wet or dry etch is then performed to remove the insulative layers 36 and 28 in the window 40 of the photo resist 38 to provide apertures 40 and 44 respectively as shown in FIG. 7. The etch stop 26 acts as an etch stop. Thus the etching process in not dependent upon time, processing or variation in thicknesses of layers 28 or 36. Apertures are also formed in the top layer 36 to expose portions of the third level interconnect 34 for the bond pads, even though not shown.

Next an etch is performed to selectively etch the etch stop 26 through apertures 42 and 44 in the insulative layers 36 and 28 without etching the exposed portions of the third level material 34. By selecting the second material of 26 to be different from the third material of 32, 34, the etching can be selectively performed using a single photo resist mask 38. For example, the second material 26 may be CVD tungsten, the third material 32, 34 aluminum and the selective tungsten dry etch SF6, BCL3 or wet etch H₂O₂. If, the second material of 26 and third material of 32, 34 are the same, only the apertures 42 and 44 are formed to expose the etch stop layer 26 and no apertures are formed to expose the bonding pads. After the laser trimming, a second photo resist mask would be used to expose only the bonding pads.

Figure 8:
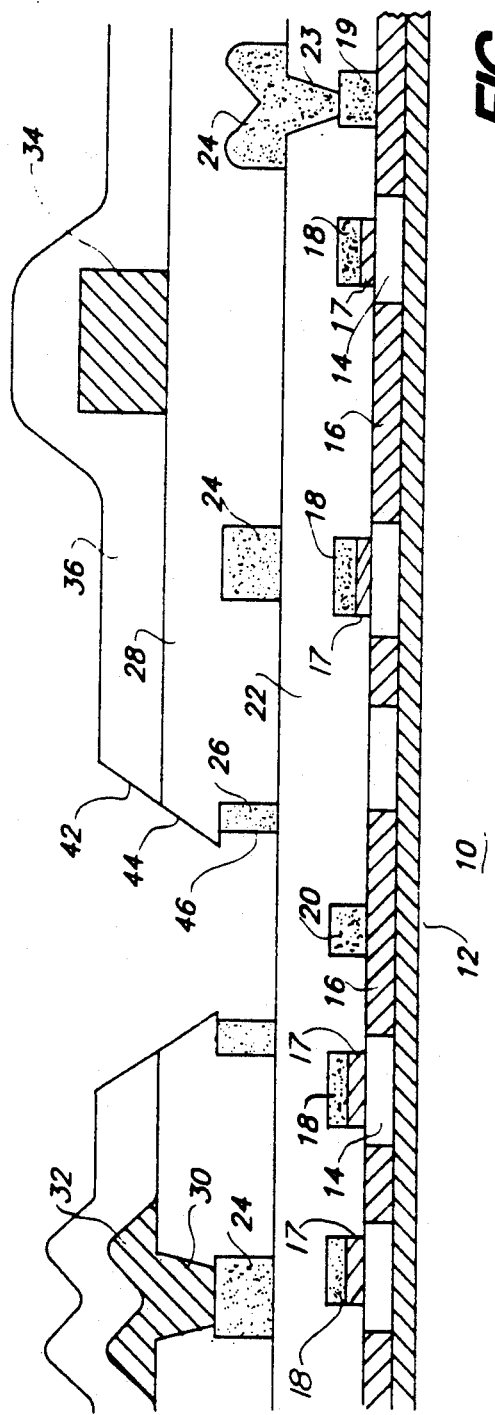
Figure 9:
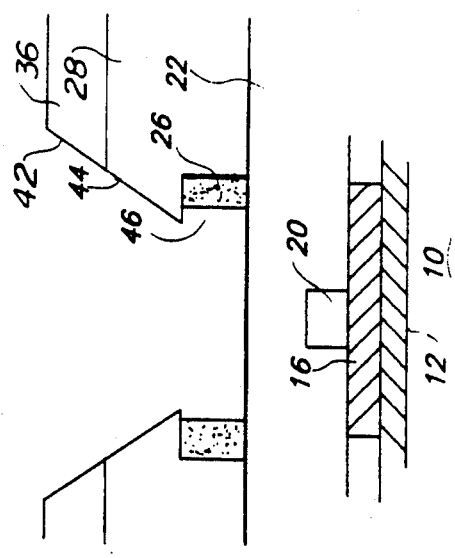

The aperture or laser trimming window 46 formed in the etch stop 26 exposes the surface of insulative layer 22 juxtapose the area of interconnect 20 of the first level interconnects which is to be laser trimmed as illustrated in FIG. 8. The lateral dimension of aperture 46 is greater than the lateral dimension of the area 20 to be laser trimmed. Preferably, dry etching is used to form the laser trimming window 46 in etch stop 46 to have vertical walls. This minimizes the lateral area of the window 46 and prevents undercutting of the apertures 44 in insulative layer 28. If this is not a concern, a wet etch can be used to form window 46 in etch stop 26. Laser trimming is then performed through the apertures 42, 44 and 46 and the insulative layer 22 to laser trim the exposed portion of the first interconnect layer 20. In the example of programming the interconnects, the cross-section of interconnect 20 is destroyed to create a gap and thus act as a laser programmable fuse. This is illustrated in FIG. 9 by the void in the insulative layer 20 where the interconnect 20 existed in FIG. 8. The heat produced by the laser will cause some reflow of the insulative layer 22 and probably cover or cap the lateral ends of the interconnect 20.

As a typical example, the first layer of contacts and interconnects 18, 19, 20 are preferably polycrystalline semiconductor materials. Thus for example, if the mesas 14 are silicon, the first level of interconnects 18, 19 and 20 are polycrystalline silicon. To provide the selective etching of the etch stop 26 compared to the third interconnect level 32, 34, the second interconnect level 24, 26 may be for example, polycrystalline silicon or tungsten and the third interconnect level 34, 32, can be aluminum. The insulative layers are various forms of oxide, nitride or other well known insulative materials.

A typical example of dimensions, are the first level of interconnects 18, 19, 20, having a thickness in the range of 1K to 10K angstroms. The first insulator 22 has a thickness in the range of 1K to 10K angstroms. The difference between the thickness of layer 22 after planarization and the thickness of the first interconnect layer 18, 19, 20 should be less than 9,000 angstroms for the YAG laser. A typical example of the thickness of the second interconnect level 24 and etch stop 26 is in the range of 1K to 10K angstroms. The second insulative layer 28 has a thickness in the range of 1K to 10K angstroms. The third interconnect 32, 34 would have a thickness in the range of 2K to 30K angstroms and the final insulative layer 36 would have a thickness in the range of 2K to 20K angstroms.

As discussed previously, the thickness of the insulative layer 22 above the first interconnect layer 20 must be thin enough within the three sigma variation to allow the laser to trim the area 20 therethrough. It should also be noted, that by forming an aperture 46 in the etch stop 26, the etch stop not only acts as an etch stop in forming the apertures 42, 44 in the insulative layers 36, 28 respectively, but also prevents undercutting of the aperture 44 in the second insulative layer 28. Similarly, it prevents any undercutting of insulative layer 28 adjacent the surface of 22. The present process reduces the outside thickness variability by eliminating the deposition and etching sigmas of layers 28 and 36. Thus the laser trim can reproducedly trim the trimmable regions 20 below the insulative layer 22.

The etch stop 26 has been described as being part of the second interconnect level to allow programming of material 20 on the first interconnect level. The principal is applicable to any level of laser trimming or programming wherein the thickness of the insulative layer is critical to the trimming process. For example, the material of the first level 18, 19, 20 could be used as the etch stop for programming of a portion of the semiconductor regions 14. Similarly, the third interconnect level 32, 34 may be used as an etch stop to program interconnects on the second level 24.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. An integrated circuit having a laser trimmed area comprising:
    a substrate having a first material;
    a first insulative layer covering said substrate, said first material and an area of said first material which has been laser trimmed through said first insulative layer forming a gap in said first material at said area;
    a second material on said first insulative layer including a portion having a first aperture exposing said first insulative layer juxtaposing said laser trimmed area; and
    a second insulative layer over said second material and said first insulative layer and having a second aperture exposing said first aperture in said second material.

2. An integrated circuit according to claim 1, wherein said first material is a semiconductor portion in said substrate.

3. An integrated circuit according to claim 2, wherein said first material is a portion of a memory array.

4. An integrated circuit according to claim 1, wherein said second material includes a first level of interconnects between said first and second insulative layers.

5. An integrated circuit according to claim 1, wherein said area to be laser trimmed is part of a second level of contacts and interconnects of said first material between said substrate and said first insulative layer.

6. An integrated circuit according to claim 1, including a third level of interconnects of a third material on said second insulative layer of a different material than said second material.

7. An integrated circuit according to claim 6, wherein said second and third materials are metals and said first material is a polycrystalline semiconductor on said substrate.

8. An integrated circuit according to claim 1, wherein said second material is selectively etchable compared to said second insulative layer.

* * * * *